US006918779B2

(12) United States Patent
Liao

(10) Patent No.: US 6,918,779 B2
(45) Date of Patent: Jul. 19, 2005

(54) TOOL FOR ATTACHING INTEGRATED CIRCUIT PACKAGE TO ELECTRICAL CONNECTOR

(75) Inventor: Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/670,648

(22) Filed: Sep. 24, 2003

(65) Prior Publication Data

US 2004/0175967 A1 Sep. 9, 2004

(30) Foreign Application Priority Data

Mar. 7, 2003 (TW) ...................................... 92203520 U

(51) Int. Cl.[7] ........................ H01R 4/50; H01R 13/625
(52) U.S. Cl. .......................... 439/342; 439/68; 439/330
(58) Field of Search ................................ 439/330, 342, 439/266, 68–73

(56) References Cited

U.S. PATENT DOCUMENTS 4,846,703 A * 7/1989 Matsuoka et al. ............. 439/71
5,288,240 A * 2/1994 Savant ........................ 439/266
5,322,446 A * 6/1994 Cearley-Cabbiness ....... 439/73
5,352,130 A * 10/1994 Nagumo ...................... 439/266

* cited by examiner

Primary Examiner—Michael C. Zarroli
(74) Attorney, Agent, or Firm—Wei Te Chung

(57) ABSTRACT

A tool (3) is used for attachment of an integrated circuit package onto an electrical connector. The tool includes a substantially rectangular base (30) defining a pair of chambers (36) in two adjacent sides thereof, and a pair of actuation members (31) disposed in the chambers respectively. Each actuation member includes a connecting portion (310) extending from a bottom of the base, a driving portion (312) extending perpendicularly upwardly from a distal end of the connecting portion, and an operating portion (314) extending arcuately and then slantingly upwardly and outwardly from an outside of the driving portion. The operating portion of each of the actuation members protrudes out from a respective one of said adjacent sides of the base, and is pushable to pull an upper section of the driving portion outwardly.

12 Claims, 4 Drawing Sheets

TOOL FOR ATTACHING INTEGRATED CIRCUIT PACKAGE TO ELECTRICAL CONNECTOR

BACKGROUND OF THE INVENTION

1. Field of the Invention

The present invention relates to a tool receiving an electrical connector thereon for assisting in attaching an integrated circuit package such as a land grid array (LGA) central processing unit (CPU) onto the connector with zero insertion force, whereby the CPU can subsequently electrically connect with a circuit substrate such as a printed circuit board (PCB). This application relates to another contemporaneously filed application having the same title, the same applicant and the same assignee with the instant application.

2. Description of the Prior Art

Referring to FIG. 4, a conventional electrical connector 9 is used for electrically connecting an integrated circuit package such as a land grid array (LGA) central processing unit (CPU) 8 with a circuit substrate such as a printed circuit board (PCB) (not shown). The connector 9 comprises a substantially rectangular insulative housing 91, and a plurality of electrical contacts 92 received in the housing 91. The housing 91 comprises a generally rectangular bottom wall 911, and four raised sidewalls 912 extending perpendicularly from a periphery of the bottom wall 911. A multiplicity of passageways 914 is defined in the bottom wall 911, the passageways 914 receiving a corresponding number of the contacts 92 therein. The sidewalls 912 define a generally rectangular cavity 913 therebetween, the cavity 913 receiving the CPU 8 therein. A spring arm 915 is formed in each of two adjacent sidewalls 912. A beveled block 9150 is formed at a free end of the spring arm 915, the block 9150 protruding into the cavity 913. A beveled surface 9151 is formed at an upper section of the block 9150.

In attaching the CPU 8 onto the connector 9, the CPU 8 is firstly disposed on the beveled surfaces 9151 of the spring arms 915 of the housing 91. The CPU 8 is pressed downwardly, with two adjacent sidewalls of the CPU pressing against the beveled surfaces 9151. The spring arms 915 elastically bend toward the corresponding sidewalls 912 of the connector 9, due to compression from the CPU 8. When a periphery of each of the blocks 9150 resiliently abuts against a corresponding sidewall of the CPU 8, a multiplicity of metallic contact pads (not shown) of the CPU 8 electrically contacts corresponding contacts 92 of the connector 9. The connector 9 is electrically connected with the PCB, and thereby electrically interconnects the PCB with the CPU 8.

The CPU 8 is typically made of porcelain, and the housing 91 is typically made of insulative material such as plastic. During the above-mentioned operation, the CPU 8 is liable to scrape the blocks 9150 of the connector 9. Some particles scraped from the blocks 9150 are liable to stick on a bottom of the CPU 8, and be located between the contact pads of the CPU 8 and the contacts 92 of the connector 9. This leads to disruption of the electrical connection between the CPU 8 and the PCB.

Additionally, the spring arms 915 are typically relatively thin. Portions of the spring arms 915 adjoining the corresponding sidewalls 912 are liable to be broken during the above-mentioned operation. On the other hand, when the spring arms 915 are relatively thick, the spring arms 915 may not elastically bend sufficiently. In this case, the CPU 8 may not electrically contact the contacts 92 of the connector 9 securely and reliably.

In view of the above, a tool for assisting the connector 9 in overcoming the above-mentioned disadvantages is desired.

SUMMARY OF THE INVENTION

Accordingly, an object of the present invention is to provide a tool which receives an electrical connector thereon for assisting in readily attaching an integrated circuit package such as a land grid array (LGA) central processing unit (CPU) onto the connector with zero insertion force, whereby the CPU can subsequently electrically connect with a circuit substrate such as a printed circuit board (PCB).

To achieve the above-mentioned object, a tool in accordance with a preferred embodiment of the present invention comprises a generally rectangular base defining a pair of chambers in two adjacent sides thereof, and a pair of actuation members disposed in the chambers respectively. Each actuation member includes a connecting portion extending from a bottom of the base, a driving portion extending perpendicularly upwardly from a distal end of the connecting portion, and an operating portion extending arcuately and then slantingly upwardly and outwardly from an outside of the driving portion. The operating portion of each of actuation members protrudes out from a respective one of said adjacent sides of the base, and is pushable to pull an upper section of the driving portion outwardly.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
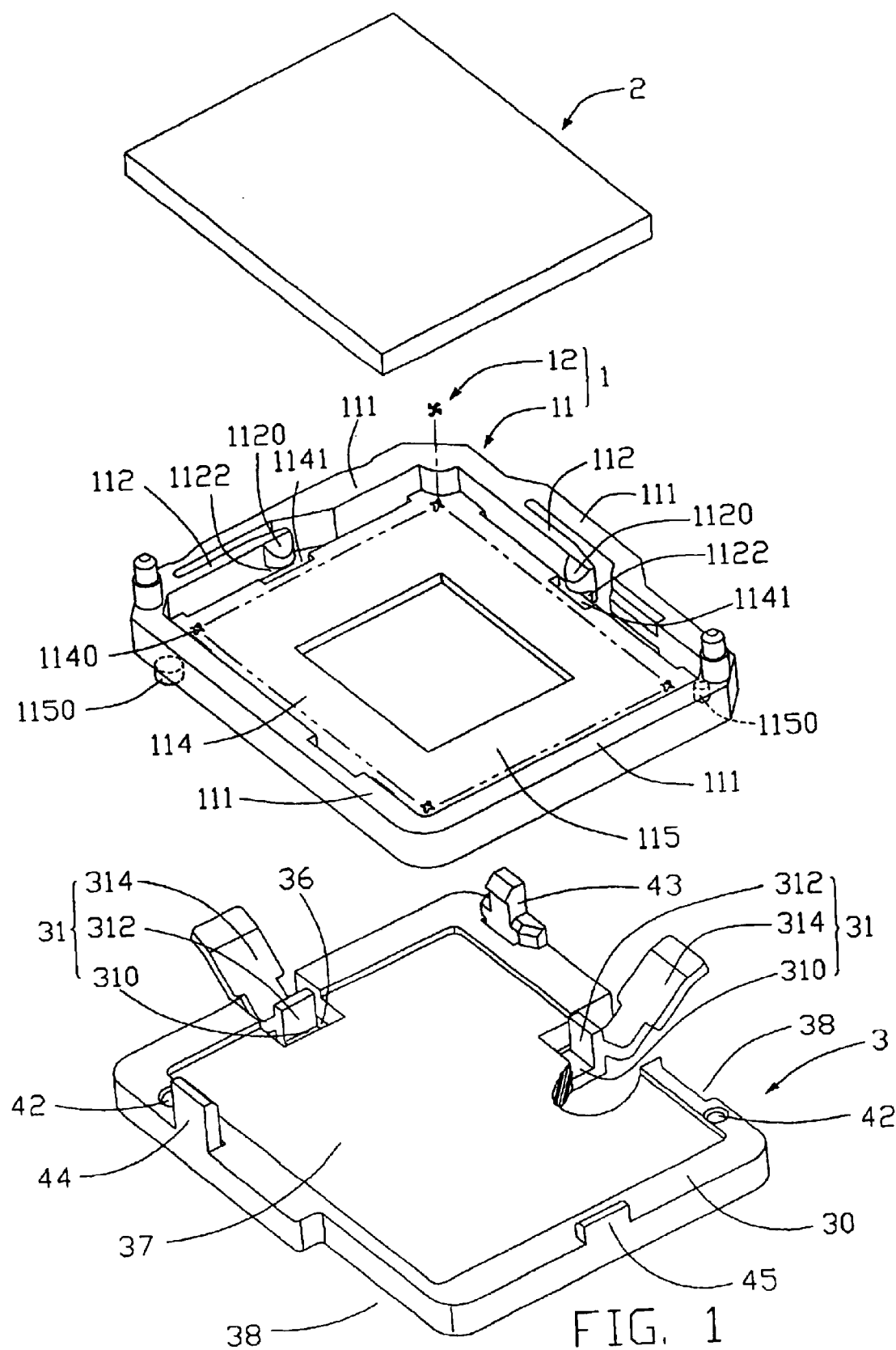
FIG. 1 is a partly cut-away, isometric view of a tool in accordance with the preferred embodiment of the present invention, together with an electrical connector ready to be received on the tool, and a CPU ready to be received in the electrical connector.
Figure 2:
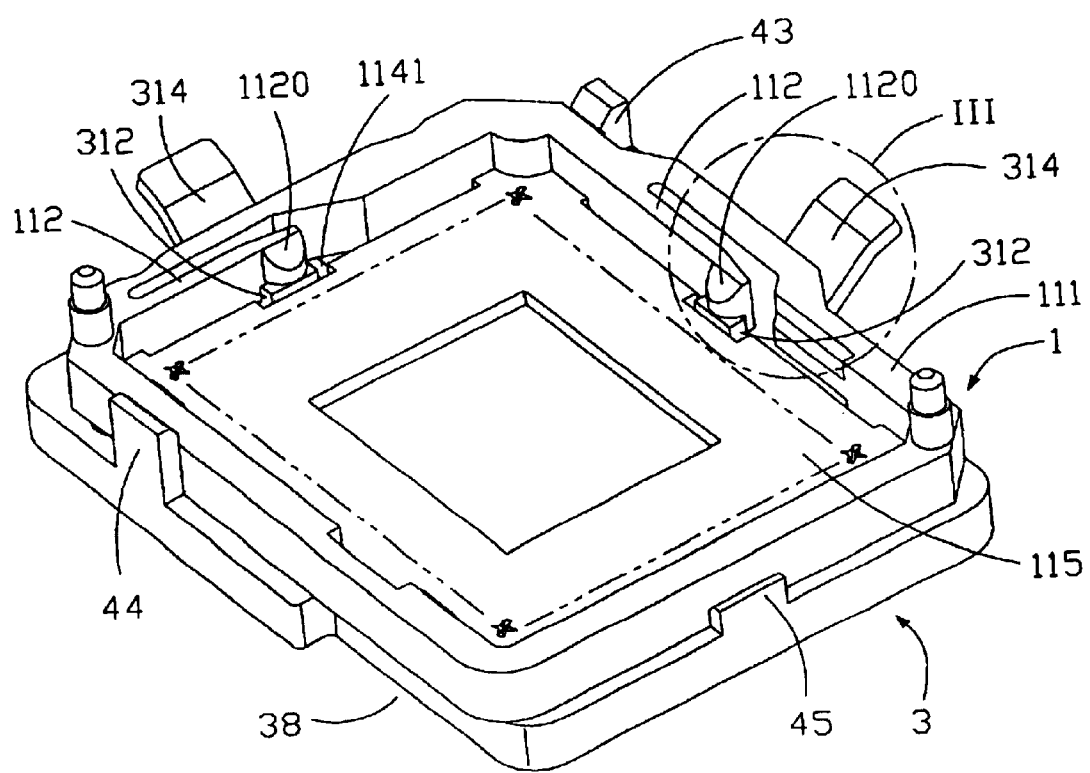
FIG. 2 is an enlarged, assembled view of the tool and the electrical connector of FIG. 1.

Referring to FIG. 1, a tool 3 in accordance with the preferred embodiment of the present invention supports a bottom of an electrical connector 1 for assisting in attaching an integrated circuit package such as a land grid array (LGA) central processing unit (CPU) 2 to the connector 1 with zero insertion force. The connector 1 can thus provide electrical connection between the CPU 2 and a circuit substrate such as a printed circuit board (PCB) (not shown) on which the connector 1 is subsequently mounted.

The connector 1 comprises a substantially rectangular insulative housing 11, and a plurality of electrical contacts 12 (only one shown) received in the housing 11. The housing 11 comprises a generally rectangular bottom wall 114, and four raised sidewalls 111 extending perpendicularly from a periphery of the bottom wall 114. A multiplicity of passageways 1140 is defined in the bottom wall 114, the passageways 1140 receiving a corresponding number of the contacts 12 therein. A pair of protrusions 1150 depends from two diagonally opposite corners of the bottom wall 114 respectively. The sidewalls 111 define a generally rectangular cavity 115 therebetween, the cavity 115 receiving the CPU 2 therein. A spring arm 112 is formed in each of two adjacent sidewalls 111. Each spring arm 112 is relatively thick compared with an overall thickness of its sidewall 111, and forms a beveled block 1120 at a free end thereof. An engaging surface 1122 is defined on the free end of the spring arm 112 under the block 1120. The block 1120 protrudes into the cavity 115. An elongate slot 1141 is defined in the bottom wall 114 below each spring arm 112. Each contact 12 comprises an engaging portion securely received in a corresponding passageway 1140, a first contact portion protruding out from a top of the bottom wall 114 for electrically contacting the CPU 2, and a second contact portion protruding out from a bottom of the housing 11 for electrically contacting the PCB.

The tool 3 is substantially rectangular, and larger than the housing 11 of the connector 1. The tool 3 comprises a substantially rectangular insulative base 30, and a pair of actuation members 31 at two adjacent sides of the base 30 respectively. A generally rectangular opening 37 is defined in a middle of the base 30, for receiving the second contact portions of the contacts 12. A pair of holes 42 is defined in two diagonally opposite corners of the base 30, corresponding to the protrusions 1150 of the connector 1. A pair of clasps 43, 44 is formed at the two opposite sides of the base 30 respectively, and a projecting member 45 is formed at another side of the base 30 between said two opposite sides. A pair of chambers 36 is defined in said two adjacent sides of the base 30, corresponding to the blocks 1120 of the connector 1 respectively. A pair of recesses 38 is defined in said two opposite sides of the base 30, for facilitating detachment of the connector 1 from the tool 3.

The actuation members 31 are disposed in the chambers 36 of the base 30 respectively. Each actuation member 31 comprises a connecting portion 310 extending from a bottom of the base 30, a driving portion 312 extending perpendicularly upwardly from a distal end of the connecting portion 310, and an operating portion 314 extending arcuately and then slantingly upwardly and outwardly from an outside of the driving portion 312. The operating portion 314 protrudes out from a respective one of said adjacent sides of the base 30.

Figure 3:
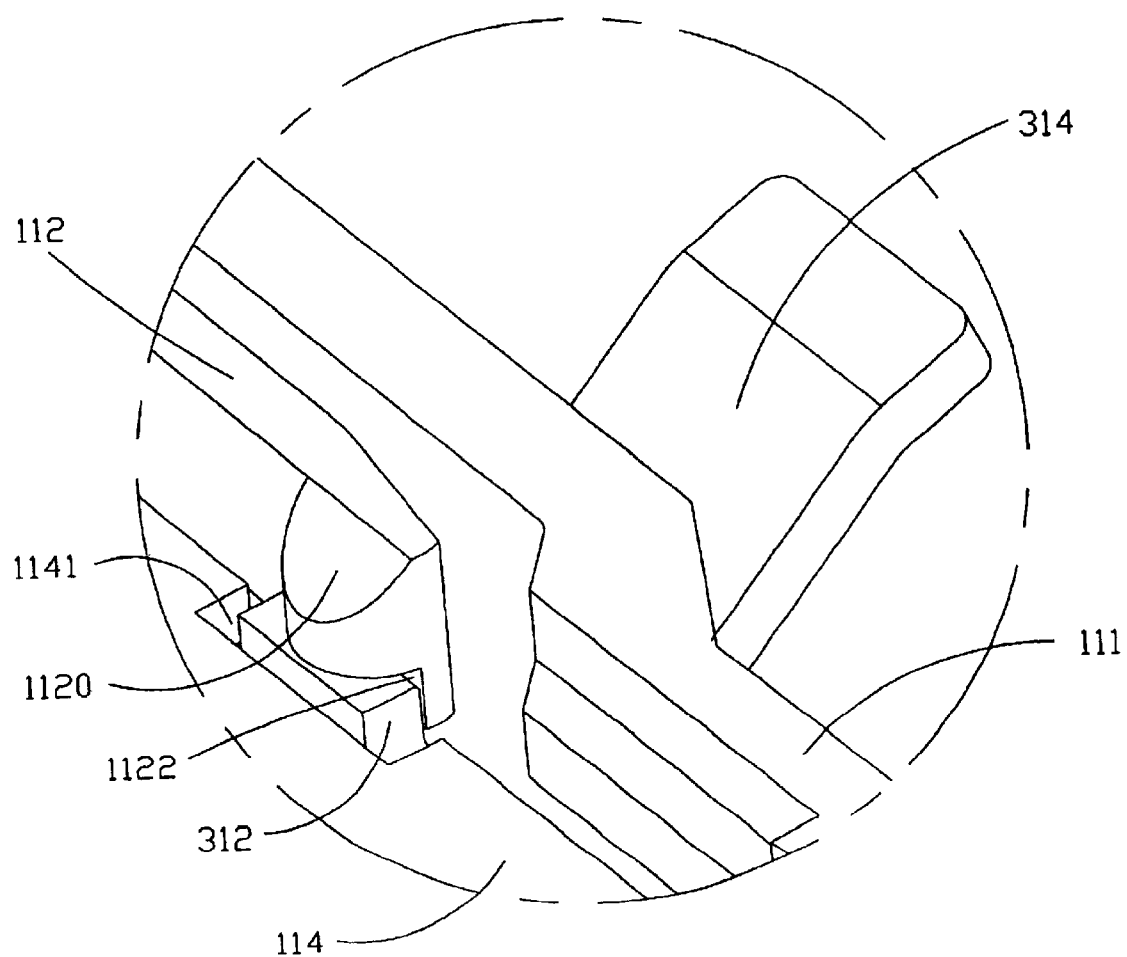
FIG. 3 is an enlarged view of a circled portion III of FIG. 2.
Figure 4:
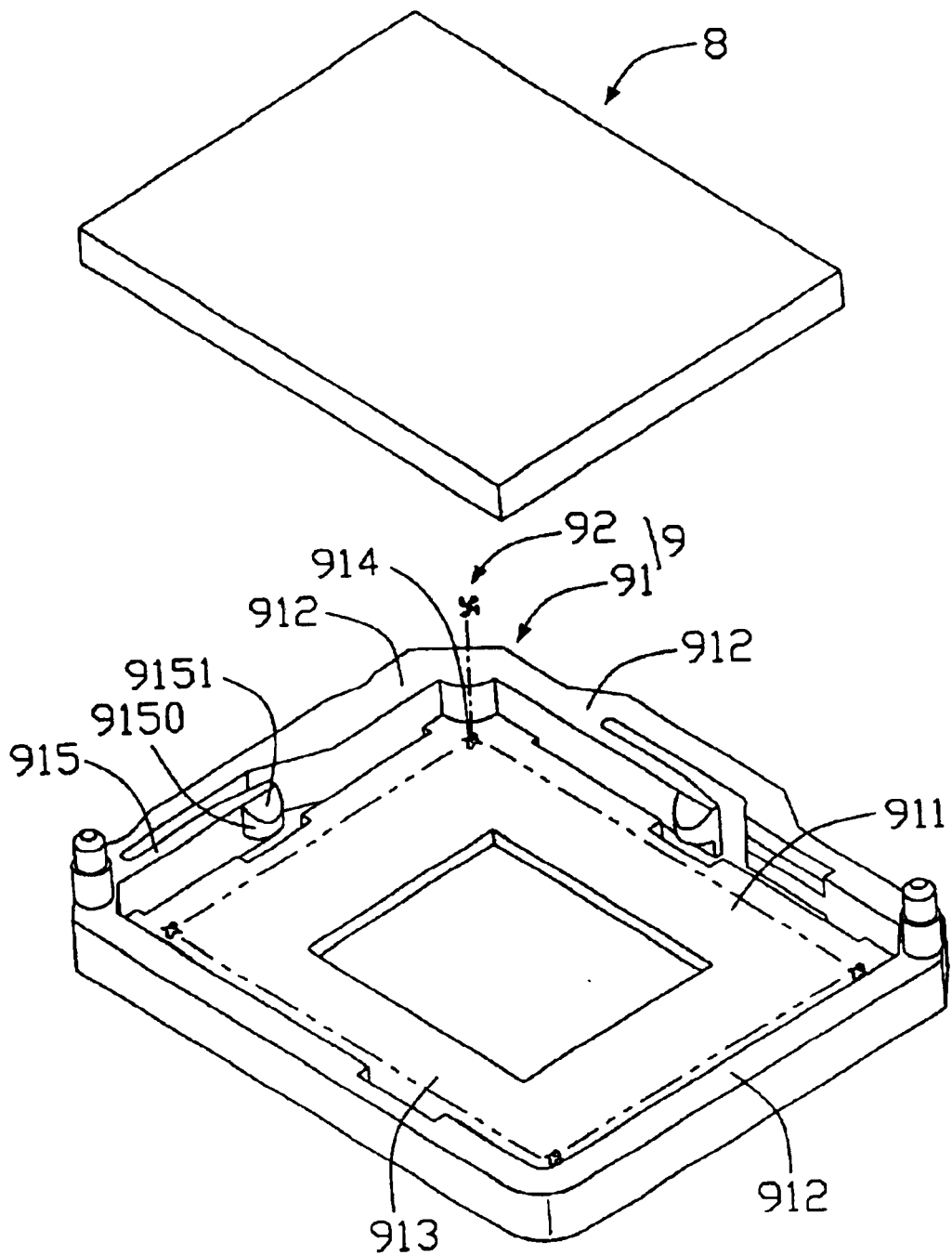
FIG. 4 is a simplified, exploded isometric view of a conventional electrical connector together with a CPU.

Referring to FIG. 3, in assembly of the connector 1 and the tool 3, the connector 1 is disposed on the tool 3, with the protrusions 1150 of the connector 1 above the corresponding holes 42 of the tool 3, and three of the sidewalls 111 of the connector 1 respectively resting on the projecting member 45 and the clasps 43, 44. The connector 1 is pressed down, and the protrusions 1150 of the connector 1 are received in the corresponding holes 42. The projecting member 45 of the tool 3 interferentially engages with a corresponding sidewall 111 of the connector 1. The clasps 44, 45 engage against corresponding sidewalls 111 of the connector 1. Upper sections of the driving portions 312 of the tool 3 pass through the slots 1141 of the connector 1 and loosely abut the engaging surfaces 1122 of the spring arms 112.

In attaching the CPU 2 onto the connector 1, the operating portions 314 of the actuation members 31 are pushed downwardly. The operating portions 314 pull upper sections of the driving portions 312 outwardly. The driving portions 312 push the engaging surfaces 1122 outwardly, so that the spring arms 112 elastically bend toward the corresponding sidewalls 111 of the connector 1, even though the spring arms 112 are relatively thick. Moreover, the relatively thick spring arms 112 inherently resist breakage. The blocks 1120 of the spring arms 112 are withdraw from the cavity 115 toward the sidewalls 111. The CPU 2 is then placed into the cavity 115 with zero insertion force. That is, the CPU 2 does not scrape the blocks 1120. The operating portions 314 are then released, and the spring arms 112 elastically rebound toward their original positions and press against adjacent side walls of the CPU 2. Thus, the CPU 2 is securely retained in the connector 1.

Then the combined connector 1 and CPU 2 is detached from the tool 3, and the connector 1 is electrically connected with the PCB. The connector 1 thus provides reliable electrical connection between the CPU 2 and the PCB.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly comprising:
    an electrical connector comprising:
        an insulative housing comprising a bottom wall, four raised sidewalls extending from a periphery of the bottom wall, a spring arm formed in one of the sidewalls and having an engaging surface at a free end thereof, and an elongate slot defined in the bottom wall below the spring arm; and
        a plurality of electrical contacts received in the housing; and
    a substantially rectangular tool receiving the housing thereon, one side of the tool defining a chamber, an actuation member being disposed in the chamber, the actuation member comprising a driving portion and an operating portion extending from a middle section of the driving portion and protruding out from the tool, a lower section of the driving portion connectting with the tool, the upper section of the driving portion being received through the slot of the connector and abutting the engaging surface, the operating portion being pushable to drive the spring arm elastically toward said one of the sidewalls of the connector.

2. The electrical connector assembly as claimed in claim 1, wherein a pair of clasps is formed at opposite sides of the tool, the clasps engaging against corresponding sidewalls of the connector.

3. The electrical connector assembly as claimed in claim 2, wherein a projecting member is formed at another side of the tool, the projecting member interferentially engaging with another corresponding sidewall of the connector.

4. The electrical connector assembly as claimed in claim 1, wherein a pair of holes is defined in two diagonally opposite corners of the tool, the holes recieving protrusions formed at two diagonally opposite corners of the connector therein.

5. The electrical connector assembly as claimed in claim 1, wherein the tool defines a pair of recesses in opposite sides thereof, for facilitating detachment of the connector from the tool.

6. The electrical connector assembly as claimed in claim 1, wherein a connecting portion connects a bottom edge of the driving portion of each actuation member with a bottom of the tool.

7. The electrical connector assembly as claimed in claim 1, wherein a middle portion of the tool defines a substantially rectangular opening, the opening receiving portions of contacts protruding out from a bottom of the connector.

8. In combination, an electrical connector comprising:

an insulative housing defining a bottom wall with raised side walls extending upward on a periphery thereof;

a receiving cavity defined among said side walls and above said bottom wall;

a plurality of contacts disposed in the base wall with contact portions extending upwardly into the receiving cavity;

at least on spring arm located around one of said raised side walls with an engagement block, at a distal end thereof, extending inwardly to the receiving cavity for retaining a CPU in said receiving cavity; and an auxiliary tool being discrete from the housing and including grasping devices detachably attached to the housing; wherein said tool includes an actuating member with an operating portion easily accessible from an exterior and a driving portion engageably moveably around said spring arm for deflecting said spring arm outwardly during installation of said CPU into the receiving cavity.

9. The combination as claimed in claim 8, wherein said auxiliary tool is upwardly attached to the housing from a bottom side of the housing.

10. The combination as claimed in claim 8, wherein said auxiliary tool is required to be removed from the housing after the CPU is installed into the receiving cavity and before the connector and the associated CPU are mounted to a mother board.

11. The combination as claimed in claim 8, wherein said housing defines a slot located around said spring arm and in downwardly communication with the exterior, through which said driving portion extends upwardly.

12. The combination as claimed in claim 11, wherein said slot is generally located below said engagement block.

\* \* \* \* \*